United States Patent
Stesmans et al.

(10) Patent No.: US 6,358,866 B1
(45) Date of Patent: Mar. 19, 2002

(54) METHOD FOR POST-OXIDATION HEATING OF A STRUCTURE COMPRISING $SIO_2$

(75) Inventors: André Stesmans, Zonhoven; Valery V. Afanas'ev, Leuven, both of (BE)

(73) Assignees: IMEC vzw; Katholieke Universiteit Leuven Research and Development, both of Leuven (BE)

( * ) Notice: Subject to any disclaimer, the term of this patent is extended or adjusted under 35 U.S.C. 154(b) by 0 days.

(21) Appl. No.: 09/346,488

(22) Filed: Jul. 1, 1999

Related U.S. Application Data (60) Provisional application No. 60/134,142, filed on May 14, 1999.

(51) Int. Cl.$^7$ .............................. H01L 21/324
(52) U.S. Cl. ...................................... 438/770; 438/778
(58) Field of Search ................................. 438/770, 787

(56) References Cited

U.S. PATENT DOCUMENTS

| | | |
|---|---|---|
| 3,925,107 A | 12/1975 | Gdula et al. |
| 5,244,843 A * | 9/1993 | Chau et al. ................. 438/452 |
| 5,502,010 A | 3/1996 | Nadahara et al. |
| 6,136,727 A * | 10/2000 | Ueno ......................... 438/770 |

FOREIGN PATENT DOCUMENTS

| | | |
|---|---|---|
| EP | 0 264 774 A2 | 4/1988 |
| EP | 0 399 664 A1 | 11/1990 |
| EP | 0 694 960 A1 | 1/1996 |

OTHER PUBLICATIONS

Clement, M.; de Nijs, J.M.M.; van Veen, A.; Schut, H.; and Balk, P. Effect of Post–Oxidation Anneal on VUV Radiation–Hardness of the Si/SiO2 System Studied by Positron Annihilation Spectroscopy. IEEE Transactions on Nuclear Science, vol. 42, No. 6, Dec.* 1995, pp. 1717–1724.*

Ohmi, T.; Nakamura, K.; Makihara, K. Highly–Reliable Ultra–Thin Oxide Formation Using Hydrogen–Radical–Balanced Steam Oxidation Technology. Reliability Physics Symposium, 1994. 32nd Annual Proceedings IEEE International, 1994, pp 161–166.*

A. Stesmans, et al.; "Blocking of Thermally Induced Interface Degradation in (111) $Si/SiO_2$ by He", J. Phys.: Condens. Matter, 10 L367–371 (1998).

A. Stesmans, et al.; "Thermally Induced Interface Degradation in (111) $Si/SiO_2$ Traced By Electron Spin Resonance"; Phys. Rev. B, 54 (16), R11 129–R11 132 (1996).

* cited by examiner

*Primary Examiner*—Richard Elms
*Assistant Examiner*—Beth E. Owens
(74) *Attorney, Agent, or Firm*—Knobbe, Martens, Olson, and Bear LLP (57) ABSTRACT

The present invention is related to a method for post-oxidation heating of at least one substrate comprising at least a $SiO_2$ layer or a $SiO_2$/poly-Si layer structure, comprising the steps of: creating an inert gaseous ambient in a furnace, said ambient having a partial pressure within a predetermined range and said gaseous ambient comprising helium molecules, which have a suitable diameter for penetrating into the $SiO_2$ and/or the poly-Si material; placing the substrate into said ambient; thereafter heating said furnace to a temperature of at least 200° C. for a predetermined period of time; cooling said furnace while maintaining said gaseous ambient in said predetermined pressure range in said furnace.

15 Claims, 6 Drawing Sheets

METHOD FOR POST-OXIDATION HEATING OF A STRUCTURE COMPRISING SIO₂

RELATED APPLICATIONS

This application claims priority from U.S. Provisional Application 60/134,142 filed May 14, 1999.

BACKGROUND OF THE INVENTION

1. Field of the Invention

The present invention is related to a method of post-oxidation heating of a substrate comprising at least a $SiO_2$ layer, or a $Si/SiO_2$ or a $Si/SiO_2/poly$-Si layer structure.

2. Description of the Related Art

The fabrication of insulated-gate field effect devices, like metal-oxide-semiconductor field-effect transistors (MOSFET), requires the preparation of a laterally uniform insulating silicon dioxide layer ($SiO_2$) on the semiconductor (Si) substrate. In order to improve the electrical characteristics of this oxide layer in terms of the fixed charge density it is necessary to apply to the thermally grown oxide a post-oxidation heating cycle (see B. E. Deal, Journal of Electrochemical Society, Vol. 121, p. 198C, 1974). Next, during device structure fabrication on the semiconductor substrate, additional high-temperature processing heating steps are required. For example such heating steps are executed in order to diffuse-in or activate doping impurities in the semiconductor substrate or in a polycrystalline silicon (poly-Si) gate grown on the silicon oxide, in order to cure ion-implantation or electron-beam induced damage, in order to enhance the wafer bonding strength, and for other processing steps.

The post-oxidation heating steps are conventionally performed at temperatures above 900° C. in an inert, non-oxidizing ambient, such as argon as suggested in document U.S. Pat. No. 3,925,107. As known in the art, such heating treatments have a negative effect on the silicon dioxide quality. These negative effects include the disintegration of thin silicon dioxide layers, development of low-voltage dielectric breakdown, and generation of hole traps in the silicon dioxide. This degradation results in an immediate impairment of the oxide as gate insulator, or hampers the MOSFET reliability through trapping of holes generated in the oxide by radiation or through trapping of holes injected from the MOSFET channel due to hot-carrier effects. Various aspects of the degradation induced by the post-oxidation heating are broadly discussed in the literature (see e.g. G. W. Rubloff et al., Physical Review Letters, Vol. 58, p. 2379, 1987; W. L. Warren et al., Applied Physics Letters, Vol. 64, p. 3452, 1994, A. Stesmans et al., Physical Review B, Vol. 54, p. R11129, 1996). The degradation is typically explained as the interface-driven formation of volatile silicon monoxide molecules (SiO) and the oxygen depletion of the silicon dioxide. In order to chemically prevent this degradation, EP-A-0264774 suggests incorporation of oxygen-containing molecules into the ambient. This method, however, is found inapplicable to thin silicon dioxide layers (<10 nm-thick) as the oxygen pressure required to suppress degradation is found to be as high as 0.3 bar (cf. FIG. 4 in S. I. Raider, Microelectronic Engineering, Vol. 22, p. 29, 1993) which leads to undesirable additional oxidation.

Furthermore, the process heating steps performed after capping of the silicon dioxide layer with polycrystalline silicon or another material are further degrading the oxide quality. Various degradation aspects, including enhanced radiation sensitivity, interface defect density and 1/f noise in the Si/Silicon dioxide/poly-Si structures are known in the art (see e.g. J. R. Schwank et al., Applied Physics Letters, Vol. 53, 770, 1988; R. A. B. Devine et al., Journal of Applied Physics, Vol. 77, p. 175, 1995; V. V. Afanas'ev et al., Applied Physics Letters, Vol. 66, p. 1653, 1995). So far, the sole way to minimize the damage caused by thermal treatment of silicon dioxide layers was found to be the reduction of the temperature and duration of the thermal treatment. The incorporation of oxygen in the heating ambient is inapplicable for the buried silicon dioxides in a $Si/SiO_2/poly$-Si structure due to the low diffusivity of the oxygen and its chemical reactivity.

In summary, the degradation of thin $SiO_2$ layers during high-temperature processing is known in Si Metal-Oxide-Semiconductor (MOS) device technology. Upon thermal treatment (heating) at temperatures $T_{an}$>600° C. in non-oxidizing ambients, the initially superb insulator degrades in terms of characteristics such as the oxide integrity (low-voltage leaks), reduced dielectric breakdown strength, enhanced vulnerability to charging under hot-carrier injection or irradiation. These defects heavily impair the production yield of MOS devices, the device performance, and the reliability of the MOS devices. The origin of the thermal $SiO_2/Si$ degradation has been related to formation of volatile SiO molecules at the oxide/silicon interfaces. This formation is suppressed in the art by adding a small amount of an oxidant, e.g. $O_2$, to the heating ambient. However, this method of chemical protection has a limited application as it causes additional oxidation undesirable in the case of thin gate oxides ($d_{ox}$<10 nm), because the partial pressure of $O_2$ necessary to maintain the oxide integrity may be as high as 0.3 atm. Moreover, because of the low diffusivity of oxygen in silicon, this method cannot prevent the oxide degradation in the most widely used device structure: $Si/SiO_2/$polycrystalline-Si.

SUMMARY OF THE INVENTION

The present invention aims to provide a method for a heating treatment which significantly reduces or eliminates, the electrical degradation of silicon oxide layers, for instance in $Si/SiO_2$ or in $Si/SiO_2/poly$-Si layer structures.

The present invention aims to disclose a novel physical, rather than chemical, method of oxide protection based on performing the heat treatments in an ambient of an inert gas, preferably He. The method of the invention allows to significantly reduce the degradation of both ultrathin and polycrystalline-Si covered $SiO_2$ layers. Consequently, replacement of the currently used heating ambients with He is beneficial for the Si MOS device fabrication.

The present invention is related to a method for post-oxidation heating of at least one substrate comprising at least a $SiO_2$ layer or a $SiO_2/poly$-Si layer structure, comprising the steps of: creating an inert gaseous ambient in a furnace, said ambient having a partial pressure within a predetermined range and said gaseous ambient comprising molecules having a suitable diameter for penetrating into the $SiO_2$ and/or poly-Si material; placing the substrate into said ambient; thereafter heating said furnace to a temperature of at least 200° C. for a predetermined period of time; cooling said furnace while maintaining said gaseous ambient in said predetermined pressure range in said furnace.

The method can further comprise the step of removing said substrate from said furnace after the step of cooling down said furnace.

The heating temperature can be comprised between 500 and 1300° C., and is preferably in-between about 550–600°

C. and about 950–1200° C. Even more preferably the heating temperature is in-between about 750–800° C. and about 900–950° C.

It is an aspect of the present invention that, following the steps of the method of the invention, the degradation of both ultrathin and polycrystalline-Si covered $SiO_2$ layers is suppressed in the temperature range of 600–800° C. and that the degradation of both ultrathin and polycrystalline-Si covered $SiO_2$ layers is reduced in the temperature range of 800–950° C.

The predetermined period of time can be smaller than 1000 hours, and is preferably larger than 1 second and smaller than 10 minutes.

The partial pressure of said ambient is comprised between 0.05 atm and 100 atm, preferably in-between about 0.1 atm and about 5–15 atm and most preferably of about 1 atm.

The inert gaseous ambient does comprise He molecules, the He-content being larger than 99%.

In general, the efficiency of the protective action of the ambient (helium) increases with increasing ambient (helium) pressure during thermal treatment.

The substrate used in the present invention can be any suitable substrate including, but not limited to, glass, quartz, sapphire, silicon, amorphous or polycrystalline silicon, silicon carbide, polycrystalline silicon carbide, silicon nitride, aluminum nitride, gallium nitride, GaAs, AlAs, metal or metallized substrates. The preferred substrate materials are silicon, polycrystalline silicon, silicon carbide such as (0001) hexagonal silicon carbide, and polycrystalline silicon carbide. The substrates can be doped; suitable dopants of silicon carbide being, in n-type silicon carbide, nitrogen, in p-type silicon carbide, boron and aluminum.

The present invention can be executed with an overlayer present on top of the silicon dioxide layer.

The overlayers on the top of silicon dioxide can be glass, silicon, polycrystalline silicon, silicon carbide, polycrystalline silicon carbide, silicon nitride, aluminum nitride, etc. The preferred overlayer material for device applications is polycrystalline silicon.

In a best mode embodiment, the present invention is directed to device applications with MOSFET semiconductor devices, the preferred substrates are p-type or n-type silicon substrates which can have any desirable orientation, e.g., (100) or (111). The preferred dopants include (but are not limited to): in n-type silicon—phosphorous and arsenic; in p-type silicon—aluminum, boron, gallium, and indium.

The silicon dioxide layer can be provided on the substrate by any known procedure including thermal oxidation of semiconductor substrate, chemical or plasma-enhanced deposition, ion implantation or transfer by bonding from the seed wafer. The silicon dioxide thickness can be in the range of 1–1000 nm, preferably, from 1.5 to 10 nm.

After the silicon dioxide layer is provided on a substrate, it can be subjected to a postoxidation heating step, or to the deposition of an overlayer followed by a heating process step. The heating temperature can be from about 500 to about 1200° C. Post-oxidation heating is preferable to be done in a range of about 800 to 1100° C., most preferably from about 800 to about 1000° C.

It is an important aspect in practicing the present invention that the inert gas ambient (He) is present in the protective ambient in sufficient concentration prior, after and during the whole thermal treatment. It is a plausible explanation of the present invention that the inert gas ambient (He) suppresses the degradation of the silicon oxide layer through physically impeding the interfacial formation of SiO. Thus the molecules of the inert gas ambient should have a diameter allowing rapid diffusion of the molecules into the silicon oxide layer and also through the overlayer, if present.

The time of thermal treatment can be chosen in the range 1 s for rapid thermal processing to 10 h for the conventional furnaces, depending on the goal of the postoxidation or processing heating. The post-oxidation heating is preferably done for 10–60 min, the processing heating for 1 min to 8 h.

The gaseous inert gas ambient (He) can be taken from any conventional source. It is most preferable to maintain the partial pressure of hydrogen-containing species in the ambient as low as possible (below $10^{-6}$ bar) during the whole thermal treatment time including heating up and cooling down.

DETAILED DESCRIPTION OF THE PREFERRED EMBODIMENT

The invention will be described in further detail with non-limiting examples. It will be obvious to the person of skill in the art that other embodiments of the invention can be imagined without departing from the true scope of the invention, the spirit and scope of the invention being limited only by the appended claims.

EXAMPLE 1

Silicon oxide layer structures are fabricated on 6 inch-diameter Czochralski grown (100) oriented n-type (doped with phosphorous) silicon substrate (wafer) having a resistivity of about 10 to about 30 Ohm cm. After standard chemical cleaning, the wafer was oxidized at 850° C. in a mixture of 90% $N_2$+10% $O_2$. The grown silicon dioxide thickness was measured ellipsometrically to be 4.1 nm. Upon the oxidation, the wafer was cut into 25×25 mm² pieces.

The wafers were subjected to heating in a double wall quartz tube vacuum furnace described previously by Stesmans et al., Physical Review B, Vol. 54, R11129 (1996), this reference being incorporated herein by reference. Heating was performed in a vacuum (<4×10⁻⁷ Torr), and in a helium, neon, argon, or molecular nitrogen gaseous ambient. The heating was done for 1 h at the temperature of 1000° C. and gas pressure of 1.1 bar. The gases were taken from condensed state to reduce moisture content of the ambient. Heating up and cooling down were done in the gaseous unaltered ambients.

Comparable results were obtained while heating the wafers with the gaseous ambient having a He content of 99.95% or 99.9999%.

After the heating, MOS capacitors were fabricated by resistive evaporation of circular gold electrodes of 0.4 mm² area and 15 nm thickness onto the oxide surface through a shadow mask. The backside metallization was done by evaporation of about a 500-nm thick aluminum layer from a resistively heated source.

Figure 1:
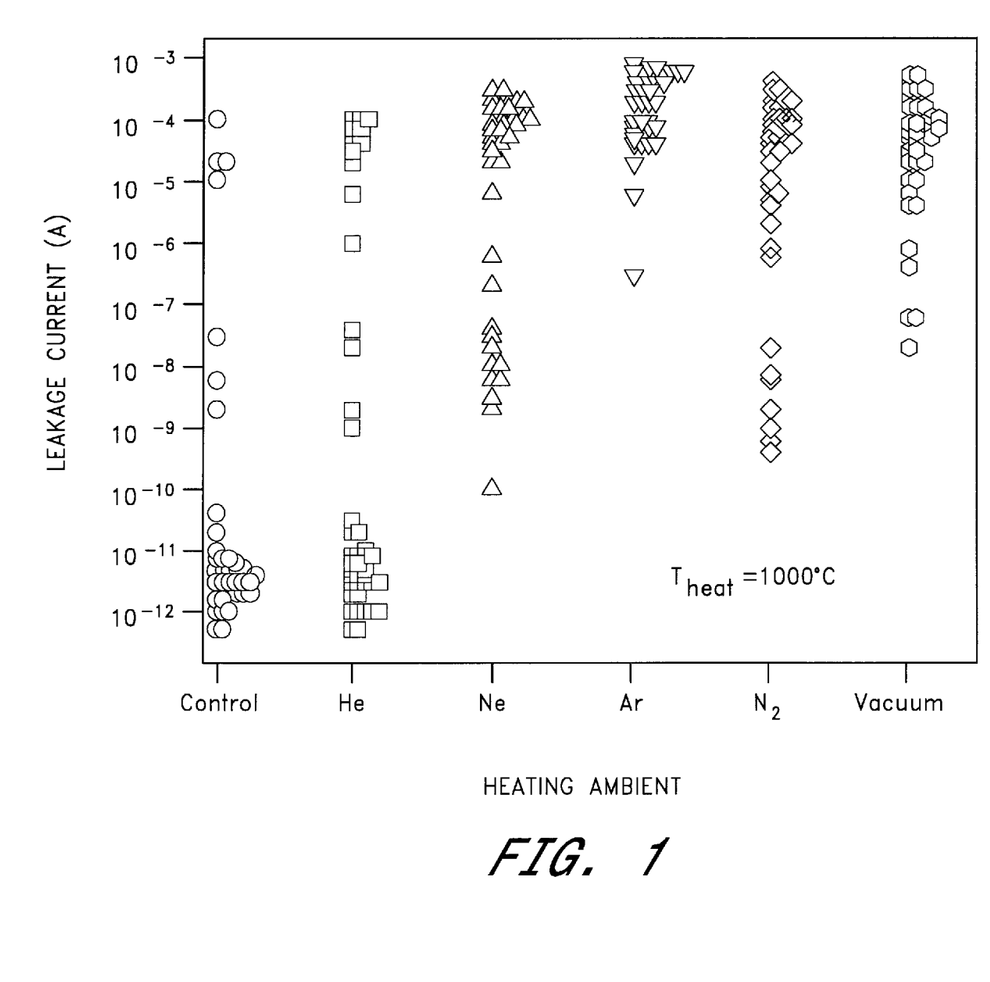
FIG. 1 shows the histogram of leakage currents measured in 50 (100) $Si/SiO_2$ (4.1 nm)/Au capacitor structures after heating in different ambients at 1000° C. carried out prior to metallization.

The silicon dioxide insulating properties were examined by measuring the current through the MOS capacitor after application of a +1.5 V potential to the metal electrode relative to the silicon substrate. The value of the current was measured by a Keithley 617 electrometer. FIG. 1 shows the histogram of the current obtained by measuring 50 MOS capacitors of identical area without heating (the control sample) and after heating in various ambients. It is seen that the heating in neon, argon, nitrogen, and vacuum results in large low-voltage current as compared to the control sample. However, application of the protecting helium ambient leaves a large portion of the MOS capacitors undamaged (no leakage current increase). The development of low-voltage leakage current indicates partial disintegration of the ultrathin silicon dioxide layer. Obviously, this process is suppressed in helium ambient.

EXAMPLE 2

Silicon oxide layer structures are fabricated on p-type (doped with boron) silicon substrates of (100) and (111) surface orientations having a resistivity of 20–30 Ohm cm and 1–2 Ohm cm, respectively, being cut from float-zone grown 4 inch diameter silicon wafers. Prior to the oxidation, the wafers were cut into 25×25 mm² pieces, and, after standard chemical cleaning, were oxidized at 970° C. in dry $O_2$ as disclosed previously by Stesmans et al., Physical Review B, Vol. 54, p. R11129 (1996), this reference being incorporated herein by reference. The oxidation was terminated by fast cooling in unaltered ambient. The grown silicon dioxide thickness was measured ellipsometrically to be 60 nm.

The wafers were subjected to heating in a double wall quartz tube vacuum furnace described previously by Stesmans et al., Physical Review B, Vol. 54, p. R11 129 (1996), this reference being incorporated herein by reference. Heating was performed in vacuum (<4×10⁻⁷ Torr), helium, neon, or argon. The heating was done for 1 h at the temperatures of 1000° C. and gas pressure of 1.1 bar. The gases were taken from condensed state to reduce moisture content of the ambient. Heating up and cooling down were done in the gaseous ambients.

After the heating, MOS capacitors were fabricated by resistive evaporation of circular gold electrodes of 0.4 mm² area and 15 nm thickness onto the oxide surface through a shadow mask. The backside metallization was done by evaporation of an aluminum layer about 500 nm thick from a resistively heated source.

Figure 2:
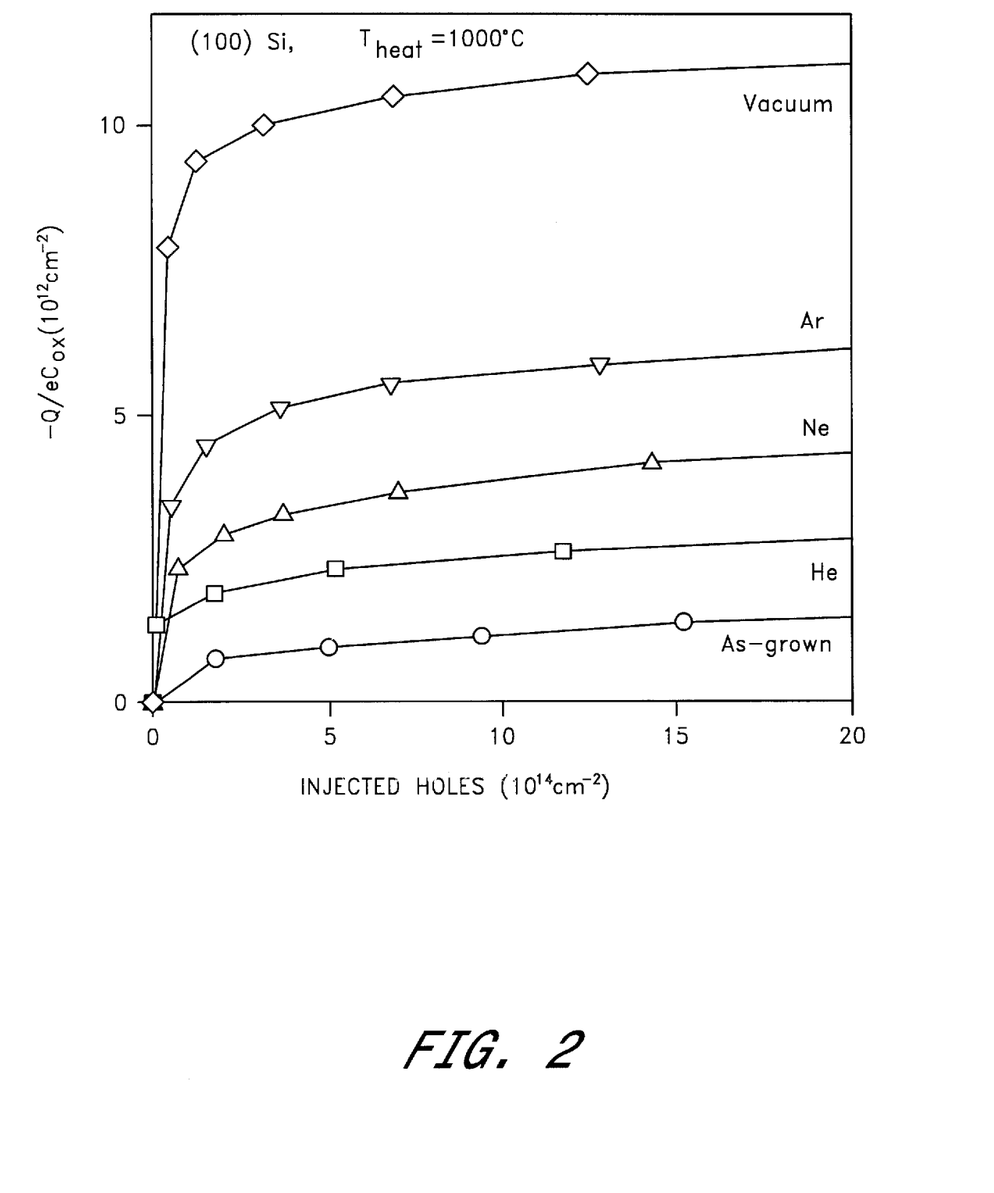
FIG. 2 shows the flatband voltage shifts, induced by hole injection into the oxide of (100) $Si/SiO_2$ (60 nm)/Au capacitor structures after heating in different ambients at 1000° C. carried out prior to metallization.
Figure 3:
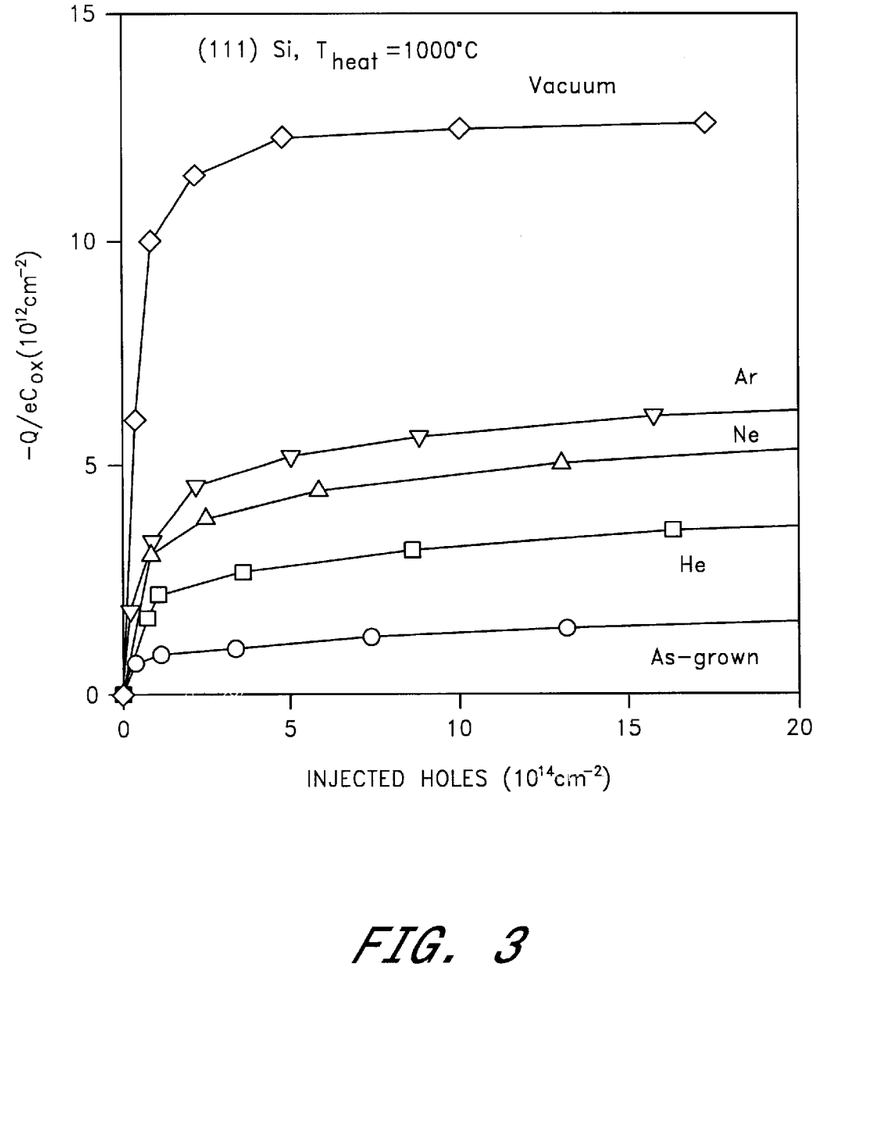
FIG. 3 shows the flatband voltage shifts induced by hole injection into the oxide of (111) $Si/SiO_2$ (60 nm)/Au capacitor structures after heating in different ambients at 1000° C. carried out prior to metallization.

The silicon dioxide hole trapping was examined using the photoelectric hole injection technique disclosed by Afanas'ev et al., Journal of Applied Physics, Vol. 76, p. 7990 (1994), this reference being incorporated herein by reference. The shift of the flatband voltage point ($\Delta V_{FB}$) on the capacitance-voltage curve taken at a frequency of 1 MHz was determined after hole injection using a Hewlett-Packard 4284A precision LCR meter. FIGS. 2 and 3 show the observed flatband voltage shifts for the control (unheated) and heated wafers. The increase of the shift corresponds to the higher density of hole traps in the silicon dioxide. The largest shift is observed for the wafers heated in vacuum, the smallest for the samples heated in the protective helium ambient. It is seen that helium efficiently suppresses the post-oxidation heating oxide degradation both on (100) and (111) silicon substrates.

EXAMPLE 3

Silicon oxide layer structures are fabricated on 6-inch diameter Czochralski grown (100) oriented p-type (doped with boron) silicon substrates having a resistivity of about 16 to about 24 Ohm cm. After standard chemical cleaning, the wafer was oxidized at 900° C. in dry $O_2$. The grown silicon dioxide thickness was measured ellipsometrically to be 25 nm. After oxidation, the silicon dioxide was covered by a 310 nm-thick layer of polycrystalline silicon (poly-Si) deposited at 620° C. Then, the wafer was cut into 25×25 mm² pieces.

The wafers were subjected to heating in a double wall quartz tube vacuum furnace described previously by Stesmans et al., Physical Review B, Vol. 54, p. R11129 (1996), this reference being incorporated herein by reference. Heating was performed in helium, neon, argon, or molecular nitrogen containing 1 volume % of oxygen. The heating was done for 1 h at 900° C. and gas pressure of 1.1 bar. The gases were taken from condensed state to reduce moisture content in the ambient. Heating up and cooling down were done in the heating ambient.

After the heating, the polycrystalline silicon layer was removed by wet etching, cleaned, and rinsed in de-ionized water. Next, MOS capacitors were fabricated by resistive evaporation of circular gold electrodes of 0.4 mm² area and 15 nm thickness onto the oxide surface through a shadow mask. The backside metallization was done by evaporation of about 500-nm thick aluminum layer from a resistively heated source.

Figure 4:
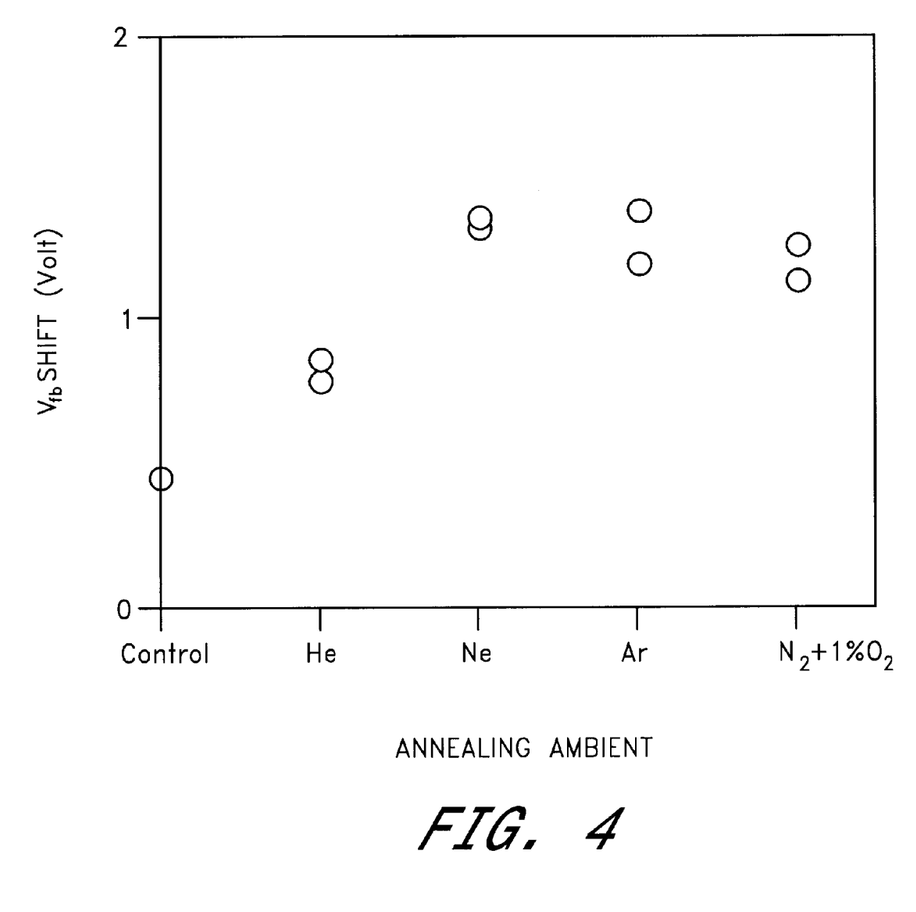
FIG. 4 shows the flatband voltage shifts after injection of $1\times10^{15}$ moles/$cm^2$ of (100) $Si/SiO_2$ (25 nm)/Au capacitor structures after heating in different ambients at 900° C. with a poly-Si cap onto the oxide. The poly-Si cap was removed prior to Au deposition.

The silicon dioxide hole trapping was examined using the photoelectric hole injection technique disclosed by Afanas'ev et al., Journal of Applied Physics, Vol. 76, p. 7990 (1994), this reference being incorporated herein by reference. The shift of the flatband voltage point ($\Delta V_{FB}$) on the capacitance-voltage curve taken at a frequency of 1 MHz was determined after injecting 5×10¹⁴ holes/cm² using a Hewlett-Packard 4284A precision LCR meter. FIG. 4 shows the observed flatband voltage shifts for the control (unheated) and heated wafers. The increase of the shift corresponds to the higher density of hole traps in the silicon dioxide. The largest shift is observed for the samples heated in argon and neon, the smallest for the samples heated in the protective helium ambient. It is seen that helium efficiently suppresses the heating-induced degradation of the oxide covered with a polycrystalline silicon overlayer.

EXAMPLE 4

Best mode embodiment

According to the best mode embodiment, Si wafers having a $SiO_2$/poly-Si overlayer structure are heated in a He ambient. The wafers are heated in a furnace with a silica insert for loading the wafers. The best mode embodiment described here makes use of a static He-ambient at about atmospheric pressure.

In an alternative embodiment however, a He-flow system can be realized resulting in a dynamic processing.

Such dynamic type of processing procedures are known in the art.

In the best mode embodiment, the furnace is rolled away from the silica inserts. Thereafter, the furnace is heated to a predetermined temperature: in the range of ~200–1200° C. The wafers are loaded in insert, the insert is closed and evacuated and thoroughly (3 to 4 times for several minutes) rinsed with the aimed ambient gas (e.g. He, Ar, Ne, $N_2$) until the intrinsic purity of the gas is reached. Thus the tube is finally permanently filled with the ambient gas aimed for. The thermal treatment is initiated by rolling the furnace to the insert; whereafter the treatment is carried out for the desired time. At the end of the heat treatment, cooling down to room temperature is executed in an unaltered ambient. The cooling procedure can be done either as a slow cool or by offsetting the furnace; resulting in semiexponential cooling. The gases of the ambient are taken from liquid source and passed through liquid-nitrogen traps. The gas purities are larger than 99.995%. The He gas bottle used for the best-mode embodiment has a purity of 99.99993% (Air Products).

The furnace is a tubular furnace with 5.0 cm open bore; conventionally (resistively) heated; electronically stabilized; stability better than 0.5° C. and the furnace can be transpositioned relative to the insert.

The insert has a double walled silica tube, being part of a high vacuum laboratory facility leak-tight to better than $10^{-10}$ Torr 1/s. The temperature uniformity over sample space is better than 0.5° C. and the radial gradient is <0.2° C./cm.

Two types of wafers were fabricated (processed at IMEC, Belgium). First, ultrathin oxides were grown on n- and p-type 6-inch (100) Si Czochralski wafers in dry $O_2$ at 800° C. following a similar procedure with an oxidizing furnace and silica insert as outlined above. The helium ambient is replaced by an oxygen ambient with an oxygen content of 99.9995%. The oxide thicknesses ranged from 2.9 to 6.0 nm. These samples were subjected to 1 h heating at 1000 or 1100° C. in pure He, Ne, Ar, $N_2$ (1.1 atm) or in high vacuum (<10-6 Torr). Second, 25-nm thick oxide was grown on p-(100)Si Czochralski substrates in dry $O_2$ at 900° C. utilizing the same oxidation procedure. Next, the oxide was covered with 310-nm thick polycrystalline Si layer deposited by chemical vapor deposition. These wafers were heated for 1 h at 850, 900 and 950° C. in pure He, Ne, Ar or in a mixture of $N_2$+1% $O_2$ utilizing the procedure as outlined above. All the gases were taken from the condensed phase to exclude water contamination. For the sake of comparison, heating of Si/$SiO_2$/poly-Si samples were also performed at elevated pressure (up to 81 bar) in the ambient of He (6.3 N pure) taken from a conventional gas bottle and passed through a liquid nitrogen trap. After the heating, the poly-Si was removed using wet etch (aqueous potassium hydroxide at 40° C.), cleaned in $H_2O_2$+HCl+$H_2O$ mixture at 80° C., and rinsed in de-ionized water. Semitransparent (15 nm thick) Au electrodes were evaporated onto the oxides in vacuum from a resistively heated source.

The impact of heating on the electrical integrity of the ultrathin oxides was investigated by measuring the dark leakage current in 50 MOS capacitors on each sample 10 s after application of a test voltage using a Keithley 617 electrometer. In FIG. 1 the results for 4.1-nm $SiO_2$/n-Si samples probed after 1000° C. heating with a test voltage of +1.5 V on the metal electrode are histogrammed. The control (unheated) wafer shows only a few leaky capacitors, with most of the structures exhibiting currents in the pA range. Upon heating in Ne, Ar, $N_2$, or vacuum, the oxide heavily degrades: no undamaged capacitors can be found, most of the structures exhibiting huge leaks related to the decomposition of the ultrathin oxide. The effect of He appears dramatic: the majority of the capacitors remains undamaged. Undamaged structures are still found even after a 1 h heating at 1100° C. in He, in sharp contrast with other ambients.

Figure 5:
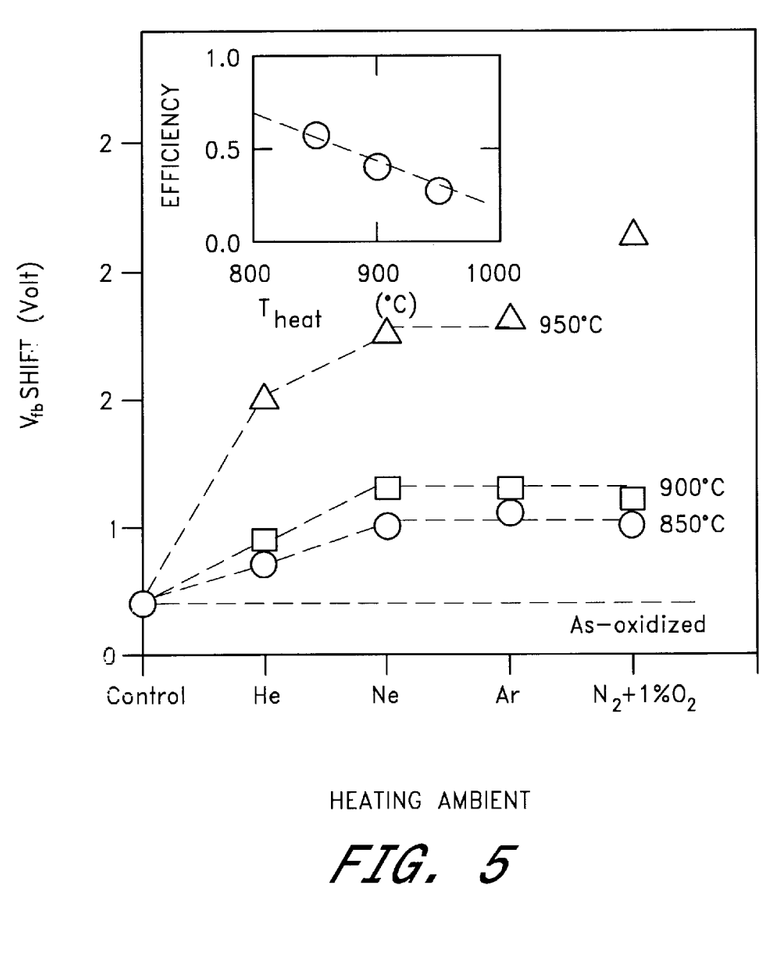
FIG. 5 shows the shift of the flatband voltage after injection of $1\times10^{15}$ holes/$cm^2$ into 25-nm thick oxides annealed with poly-Si layer on top in various ambients at different temperatures; 850 (○), 900 (□) and 950 (Δ)° C. The insert shows the efficiency of the He blockage, defined as $1-[\Delta V_{fb}(He)-\Delta V_{fb}(control)]/[\Delta V_{fb}(control)]$, as a function of the annealing temperature. Lines are guides to the eye.

The oxide degradation in the poly-Si gated wafers was probed by exposing the MOS capacitors to 10-eV photons emitted by a Kr resonant discharge lamp through a $MgF_2$ window. The holes generated in the oxide are pushed towards the Si substrate by a +3 V bias applied to the Au electrode. Those trapped by oxide defects (hole traps) in the oxide were detected by measuring the irradiation-induced shift of the flatband voltage ($V_{fb}$) point on the 1 MHz capacitance-voltage curve using a HP4284A bridge. The total density of injected charge carriers per illumination pulse was determined by integrating the photocurrent through the oxide. The $V_{fb}$ shift values observed after injection of $1\times10^{15}$ holes/cm$^2$ are shown in FIG. 5 for the control (unheated) poly-Si covered sample and the structures heated in various ambients at different temperatures. It is seen that the density of hole traps significantly increases after the heating step exposing the oxide degradation. However, in He the degradation is suppressed as compared to other ambients. The efficiency of the beneficial effect of He, defined as $1-[\Delta V_{fb}(He)-\Delta V_{fb}(control)]/[\Delta V_{fb}(Ar)-\Delta V_{fb}(control)]$, is shown in the insert in FIG. 5 as a function of heating temperature. It decreases with increasing temperature, but, definitely, there is a beneficial effect of He at $T_{an}<1000°$ C.

Figure 6:
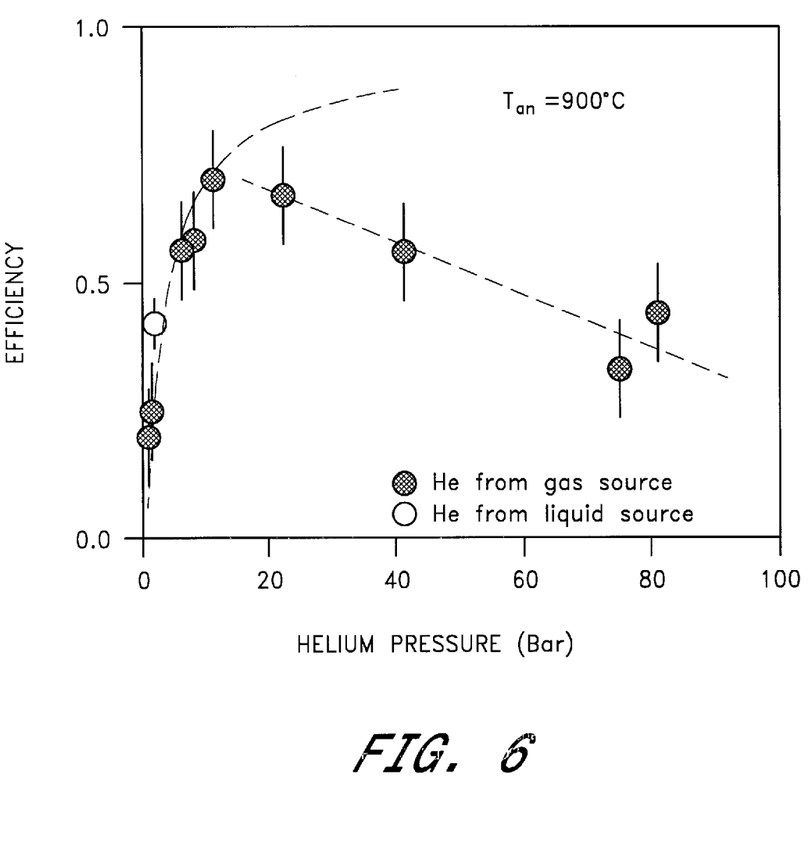
FIG. 6 shows the efficiency of the hole trap generation suppression in $polySi/SiO_2/Si$ structures as a function of the gas pressure for annealing at T=900° C. The He gas was taken from the gas source (●) or liquid He source (○). Lines are guides to the eye.

In FIG. 6 the efficiency of the suppression of hole trap generation at 900° C. in Si/$SiO_2$/poly-Si structures as a function of He pressure is shown. The data show that the beneficial effect of He can be further enhanced by increasing the pressure. However, at the highest pressures the efficiency decreases again, which we tentatively attribute to an insufficient purity of the gas source: the partial pressure of a contaminant increases proportionally with the base pressure of He. In favor of this hypothesis is the fact that the blockage efficiency of He taken from the liquid source is substantially higher than that from the gas bottle (cf. open and filled symbols at ~1 atm in FIG. 6). As the liquid $N_2$ trap appears inefficient to remove the contamination, this may be hydrogen which is known to enhance Si/$SiO_2$ degradation.

A plausible explanation of the working principle of the method of the invention is given herebelow. The mechanism of He action probably is physical in nature and may be traced down to the blockage of the SiO formation at the interfaces of $SiO_2$ with the Si substrate and the poly-Si overlayer. The blocking action of He should thus imply reduced SiO formation. In its turn, the degrading impact of SiO is related to its chemical attack of $SiO_2$, leading to the generation of oxygen deficiency centers, which act as hole traps and provide conductive paths through the oxide. Thus, when the SiO production at the interface is suppressed by He, a much reduced oxide degradation is to be expected. In contrast, the presence of hydrogen, which enhances Si/$SiO_2$ interface bond rupture, would enhance oxide degradation and counterbalance the benign effect of He. Therefore, sufficient gas purity is important for successful application of He ambient heating.

Suppression of the Si/SiO$_2$ electrical degradation by He suggests this noble gas as the best choice for the protective ambient during post-oxidation heating.

A possible understanding of the He action—obviously physical in nature—may be based on the observed differences in the blocking efficiency between the various noble gases (He, Ne, Ar). All of them remain chemically inert under the conditions of the experiments carried out for the present invention. However, they exhibit different solubility in SiO$_2$ which reflects the different atomic diameters of the gases and the size distribution of interstitial cavities in SiO$_2$. Helium, the smallest among the noble gas atoms, has the largest number of sites accessible as compared to Ne and Ar. There are at least two possibilities to affect the Si/SiO$_2$ interfacial reaction and the diffusion of the ensuing reaction product(s) into SiO$_2$. First, it may dynamically occupy the interstices necessary to accommodate large diffusing species like SiO. If the mean frequency of the cavity filling with He atoms is larger than the frequency of SiO attempts to enter this site, the incorporation of SiO and its attendant malignant consequences will be blocked. The latter were suggested to result from the interaction of SiO with defect precursors, where different precursors types account for the local (leakage current) and uniform (hole traps, interface states) oxide degradation. Such defect precursors may form spontaneously or be related to various kinds of intrinsic defects or impurities.

Second, the noble gas atoms absorbed in interstices may affect (quench) atomic vibrations in the SiO$_2$ network at elevated temperatures. As a result, fluctuations in atomic positions of large amplitude may be suppressed, thus reducing the probability of bond-breaking processes and widening of the interstitial cavities that would be needed to provide pathways to the diffusing species. Obviously, the quenching action of the noble gas will enhance the resistance of the host matrix against atomic displacements in accordance to the number of dissolved atoms. Qualitatively, this would explain the observed differences between the effect of different gases and gradual weakening of the blockage as the temperature increases (the solubility of noble gases in SiO$_2$ decreases with temperature, changing the phonon population). Nevertheless, it is realized that the above suggestions are hypothetical and the involvement of other mechanisms cannot be excluded.

Thus, helium suppresses the electrical degradation of Si/SiO$_2$ structures during post-oxidation heating. This results suggests hindering of the Si-oxide chemical interaction and subsequent reactions between SiO and the oxide as a result of physical action of the noble gas atoms occupying interstices in the SiO$_2$ network. Despite of lacking a detailed microscopic picture of the blockage process, its relevance for the practical technology is obvious. Because of the high diffusion coefficients of He in Si (D>10$^{-6}$ cm$^2$/s at T>800° C.), it is also be suitable for the heating of oxides covered with poly-Si; 1-$\mu$m thick Si layers will be permeated by He atoms within 0.01 s, which means the oxide will become fully saturated with He during the heating. Moreover, the observed suppression of the diffusion-mediated degradation suggests that He can possibly also block other processes, like oxygen out-diffusion from the oxide or boron diffusion from p+-poly-Si gate electrodes into the Si substrate through the ultrathin oxide.

It is evident that the above discussion also applies to any inert gas ambient that has similar diffusive and non-reactive properties as He.

What is claimed is:

1. A method for post-oxidation heating of at least one substrate having a structure with at least a SiO$_2$ layer, the method comprising the steps of:
   creating an inert gaseous ambient in a furnace, said ambient having a partial pressure within a predetermined range and said gaseous ambient comprising molecules having a suitable diameter for penetrating into the SiO$_2$ material, wherein said gaseous ambient comprises He molecules;
   placing the substrate into said ambient;
   thereafter heating said furnace to a temperature of at least 200° C. for a predetermined period of time;
   cooling down said furnace while maintaining said gaseous ambient within said predetermined pressure range in said furnace.

2. Method according to claim 1, wherein said gaseous ambient has a He-content larger than 99%.

3. Method according to claim 1 further comprising the step of removing said substrate from said furnace after the step of cooling down said furnace.

4. Method according to claim 1, wherein the heating temperature is comprised between 500 and 1200° C.

5. Method according to claim 4, wherein said heating temperature is in-between about 550–600° C. and about 1100° C.

6. Method according to claim 5, wherein said heating temperature is in-between about 750° C. and about 900–950° C.

7. Method according to claim 1, wherein said predetermined period of time is smaller than 1000 hours.

8. Method according to claim 1, wherein said predetermined period of time is larger than 1 second and smaller than 10 minutes.

9. Method according to claim 1, wherein the partial pressure of said ambient is comprised between 0.05 atm and 100 atm.

10. Method according to claim 8, wherein the partial pressure of said ambient is in-between about 0.1 atm and about 15 atm.

11. Method according to claim 8, wherein the partial pressure of said ambient is about 1 atm.

12. The method as recited in claim 1 wherein said substrate is a Si substrate.

13. The method as recited in claim 1 wherein said substrate is a SiC substrate.

14. The method as recited in claim 1 wherein said structure is comprising a SiO$_2$/poly-Si layer structure and wherein said gaseous ambient comprises molecules having a suitable diameter for penetrating into the poly-Si material.

15. A method for post-oxidation heating of at least one substrate having a structure with at least a SiO$_2$ layer or a SiO$_2$/poly-Si layer structure, the method comprising the steps of:
   creating an inert gaseous ambient in a furnace, said ambient having a partial pressure within a predetermined range and said gaseous ambient having a content of He-molecules larger than 99%;
   placing the substrate into said ambient;
   thereafter heating said furnace to a temperature of at least 200° C. for a predetermined period of time;
   cooling down said furnace while maintaining said gaseous ambient within said predetermined pressure range in said furnace.

* * * * *